US 6,509,770 B2

(12) United States Patent
Gossmann et al.

(10) Patent No.: US 6,509,770 B2
(45) Date of Patent: Jan. 21, 2003

(54) CHARGE PUMP AND PLL

(75) Inventors: Timo Gossmann, Neubiberg (DE);
Hans-Eberhard Kröbel, München
(DE); Markus Scholz, München (DE)

(73) Assignee: Infineon Technologies AG, Munich
(DE)

( * ) Notice: Subject to any disclaimer, the term of this
patent is extended or adjusted under 35
U.S.C. 154(b) by 0 days.

(21) Appl. No.: 10/078,144

(22) Filed: Feb. 19, 2002

(65) Prior Publication Data

US 2002/0113631 A1 Aug. 22, 2002

Related U.S. Application Data

(63) Continuation of application No. PCT/DE00/02791, filed on Aug. 17, 2000.

(30) Foreign Application Priority Data

Aug. 18, 1999 (DE) .......................... 199 39 104

(51) Int. Cl.[7] .............................. H03L 7/06
(52) U.S. Cl. ..................................... 327/157
(58) Field of Search ................... 327/147, 148, 327/150, 156, 157, 159, 162, 163, 536, 537; 375/374

(56) References Cited

U.S. PATENT DOCUMENTS

| 5,563,503 A | * | 10/1996 | Ng et al. ..................... 323/315 |
| 5,801,578 A | * | 9/1998 | Bereza ......................... 327/157 |
| 5,818,287 A | * | 10/1998 | Chow .......................... 327/157 |
| 6,222,402 B1 | * | 4/2001 | Boerstler et al. ............ 327/157 |
| 6,329,872 B1 | * | 12/2001 | Foroudi ....................... 327/112 |

FOREIGN PATENT DOCUMENTS

WO          WO 89/01263          2/1989

* cited by examiner

*Primary Examiner*—My-Trang Nuton
(74) *Attorney, Agent, or Firm*—Laurence A. Greenberg; Werner H. Stemer; Gregory L. Mayback

(57) ABSTRACT

A charge pump has a reference stage that simulates the output stage of the paths, at least in terms of the output-side transistors of the paths. An equivalent symmetrical current is generated on a reference stage. The equivalent symmetrical current replicates the fault current and controls a device for regulating the second path.

23 Claims, 6 Drawing Sheets

CHARGE PUMP AND PLL

CROSS-REFERENCE TO RELATED APPLICATION

This application is a continuation of copending International Application No. PCT/DE00/02791, filed Aug. 17, 2000, which designated the United States.

BACKGROUND OF THE INVENTION

Field of the Invention

The invention relates to a charge pump having an input side, an output side and having at least one current mirror and a transistor that are associated with a source branch for producing a source current and with a sink branch for producing a sink current. At least one path has an input-side transistor. Both paths contain an output stage with at least one output-side transistor and a circuit transistor. A first path is controlled via a reference current.

When using a phase locked loop (PLL), an oscillator VCO uses a highly accurate reference frequency to produce another highly accurate and stable frequency $F_{vco}$ that may be different from the original reference frequency. An illustrative circuit for such a PLL is shown in FIG. 5 (described later). There, a (normally) crystal-stable frequency $F_q$ is divided down to a required reference frequency $F_{ref}$ using a frequency divider R. At the same time, the output frequency $F_{vco}$ of the voltage controlled oscillator VCO is divided down to a frequency $F_{vco}/N$ using a further frequency divider N. These two divided frequencies $F_{ref}$ and $F_{vco}/N$ are supplied to a phase(-frequency) detector PD, in which they are compared to give their relative phase, that is to say, to give a frequency change relative to one another. The output of the phase detector PD produces two pulse width modulated pulse trains UP and DOWN whose pulse widths have a fixed relationship with respect to the phase difference between the frequencies at its inputs.

If the frequency $F_{vco}/N$ is excessive in comparison with $F_{ref}$, that is to say if the phase of the frequency $F_{vco}/N$ leads that of $F_{ref}$, the phase detector switches on the DOWN output for longer than the UP output. The same applies in reverse; if the phase of the frequency $F_{vco}/N$ lags that of the frequency $F_{ref}$, then the phase detector switches the UP output on for longer than the DOWN output. If the phases of the two input frequencies $F_{ref}$ and $F_{vco}/N$ in the phase detector PD are exactly the same, either no pulses or pulses of exactly the same length can be output to the two outputs of the phase detector PD on the UP and the DOWN output. If pulses of exactly the same length are output, reference is made to an "anti-backlash pulse" (ABL pulse). Producing these pulses when the phases are identical is more beneficial, from a dynamic point of view, than a circuit in which none of the two outputs is turned on when the phases are the same.

The UP and DOWN pulse trains actuate a charge pump CP having an output connected to a loop filter LF that acts like an integrator. This loop filter LF can be an active filter, or preferably, a passive filter in the phase locked loop.

A pulse on the UP line prompts the charge pump CP to feed a current of a defined magnitude into the loop filter LF, so that the voltage on the loop filter VLF rises over the duration of the UP pulse as a result of the quantity of charge that is transported into the loop filter. This action is called "sourcing" and is effected in the charge pump by the source branch.

A pulse on the DOWN line draws a current from the loop filter LF, so that the voltage tends to fall over the duration of the pulse. This action is called "sinking" and is effected by the sink branch in the charge pump.

The mean voltage change on the loop filter is thus determined, for currents of equal magnitude, exclusively by the relative durations of the UP and DOWN pulses with respect to one another. If the phases of the two input frequencies $F_{ref}$ and $F_{vco}/N$ on the phase detector are exactly the same, that is to say when the anti-backlash pulse occurs, the voltage on the loop filter LF ideally should not change, since the net current into the loop filter is equal to zero, and also since no net quantity of charge is transported into the loop filter or away from the loop filter.

The voltage v_tune that is established on the loop filter LF at the output $V_{lf}$ is now used as a control voltage for the oscillator VCO, whose frequency $F_{vco}$ or whose phase is coupled to the phase of the crystal oscillator Q by the control loop that is now connected. Altering the division ratio of the divider N allows the oscillator frequency $F_{vco}$ to be adjusted over broad ranges.

However, for this purpose, it is necessary to vary the control voltage for the oscillator, which is the same as the voltage v_tune at the output $V_{lf}$ of the loop filter LF, over a broad range to be able to keep the voltage controlled oscillator VCO at the desired frequency. Ideally, this means that the voltage range used needs to come close to the zero potential and close to the supply voltage. This is important particularly for portable applications, since in that case the supply voltage from the storage batteries available is in the region of 3 volts. In this context, it is also important for the source and sink current magnitudes to be kept at the same level, since only then, when the phase locked loop has locked during the ABL pulse, is no net charge transported, and the oscillator VCO, therefore is not detuned.

FIG. 1 shows an example of a prior art charge pump circuit configuration. The charge pump has a source branch including PMOS transistors mp1, mp2, mp3, and mp4 that are connected as a current mirror that multiplies the current i_ref_source by a prescribed mirror ratio n and feeds it from the voltage supply VDD into the output connection Pdout providing the voltage v_tune as soon as the UP control signal has a logic LOW potential. The UP control input has the inverted UP signal of the phase detector PD applied to it.

In addition, this known charge pump has a sink branch that is arranged in a mirror-inverted form with respect to the source branch, and in line with its function, is equipped with NMOS transistors mn1, mn2, mn3, and mn4 which, during a logic HIGH potential on the DOWN control connection, conduct the current i_ref_sink multiplied by the prescribed mirror ratio n away from the output connection Pdout in the direction of ground VSS.

In this circuit configuration, the problem arises that the mirror ratios in the source branch and in the sink branch can be adjusted exactly symmetrically only at a single voltage v_tune at the output Pdout, at a particular operating temperature and for particular circumstances of technological parameters (for example output impedance of the transistors, threshold voltage $V_T$ or matching). The channel length modulation in the MOS transistors, the technological variations (for example matching), and the temperature response of the electronic components mean that the currents i_source and i_sink are asymmetrical at all other voltages v_tune. Thus, for example, the transistor output impedance means that, for a rising voltage v_tune, the magnitude of the sink current becomes greater and the magnitude of the source current become less, whereas, with a falling voltage v_tune, the source current i_source becomes larger and the sink current i_sink becomes smaller.

For v_tune values close to VDD or Gnd, the output transistors mp1 and mn1 are additionally no longer operated in the (low) saturation region, which means that a noticeable reduction in the source and sink currents ensues.

In a practical implementation, this means, by way of example, that the source current i_source decreases dramatically from voltage values VDD–0.4 V upward and is finally 0 when v_tune=VDD. The same applies to the sink current i_sink, which is dramatically reduced from approximately 0.4 V downward and finally likewise becomes 0 at the voltage v_tune=0V. In practice, this means that a fault current "i_fault" is produced between the source branch and the sink branch when the source and sink sections are active at the same time. This fault current thus rises extremely at the upper and lower limits of the supply voltage, and when v_tune=VDD, results in the fault current becoming equal to the sink current i_sink, since the source current i_source becomes equal to 0, and conversely, the fault current becomes equal to the source current i_source at the voltage v_tune=0, since the sink current i_sink is equal to 0. This means that in voltage ranges v_tune close to VSS or close to VDD, the symmetry of the sink currents on the sink side i_sink and on the source side i_source is greatly disturbed.

This response from the circuit configuration having the symmetry problem outlined above means that the range that can be used for the tuning voltage v_tune is limited to a relatively narrow range of values—around a mean ideal value.

In terms of using the charge pump in a PLL loop, this means that the ABL pulse feeds no fault current i_fault into the loop filter only at a single voltage v_tune. At all other voltages, and hence at other set oscillator frequencies $F_{vco}$, the mean voltage on the loop filter can be kept constant for each PLL pass only if the ABL pulse is distorted, that is to say, either the source section or the sink section of the pump is turned on for somewhat longer. Only then is it possible for the average total charge transported to the loop filter in a reference cycle to become zero.

The ABL pulse, which is then actually asymmetrical, modulates a transient periodic component onto the voltage v_tune at the output Pdout (loop filter voltage), and this component in turn prompts the oscillator VCO to produce not only its rated frequency, but also other secondary frequencies at a distance $F_{ref}$ from the main frequency. These secondary frequencies (spurs) are undesirable.

SUMMARY OF THE INVENTION

It is accordingly an object of the invention to provide a charge pump and a phase-locked loop including the charge pump which overcome the above-mentioned disadvantages of the prior art apparatus of this general type.

In particular, it is an object of the invention to provide a charge pump in which the mirror ratios in the source branch and in the sink branch are as symmetrical as possible, both over a broad output voltage range and over a broad operating temperature range.

With the foregoing and other objects in view there is provided, in accordance with the invention, a charge pump including: a source branch for producing a source current, the source branch including at least one current mirror and a transistor; a sink branch for producing a sink current; a reference stage; and a regulating device. At least one of the source branch and the sink branch have an input-side transistor. The source branch includes an output stage having an output-side transistor and a circuit transistor. The sink branch includes an output stage having an output-side transistor and a circuit transistor. A first branch is chosen as either the source branch or the sink branch. The first branch receives and is controlled by a reference current. The reference stage simulates the output stage of the source branch, at least with regard to the output-side transistor of the source branch. The reference stage also simulates the output stage of the sink branch, at least with regard to the output-side transistor of the sink branch. The regulating device is for regulating a second branch that is chosen to be either the source branch or the sink branch. The second branch is different from the first branch. The reference stage generates an equivalent symmetrical current that replicates a fault current. The symmetrical current controlls the regulating device.

In accordance with an added feature of the invention, the regulating device includes at least one operational amplifier; the operational amplifier has inputs receiving a voltage proportional to the symmetrical current and to the fault current; and the operational amplifier has an output that influences the second branch.

In accordance with an additional feature of the invention, the regulating device includes a buffer amplifier for simulating the fault current.

In accordance with another feature of the invention, the buffer amplifier is an operational amplifier connected as a voltage follower.

In accordance with a further feature of the invention, the charge pump is used in combination with a loop filter. The output stage of the source branch and the output stage of the sink branch form a combined output stage. The loop filter is connected between the combined output stage and the regulating device.

In accordance with a further added feature of the invention, the regulating device includes an attenuation element.

In accordance with a further additional feature of the invention, the first branch includes the input-side transistor; and the second branch includes an input-side transistor.

In accordance with yet an added feature of the invention, at least one of the circuit transistor of the source branch and the circuit transistor of the sink branch is an output-side transistor.

In accordance with yet an additional feature of the invention, an output is connected between the output stage of the source branch and the output stage of the sink branch; and the circuit transistor of the source branch is configured between the output-side transistor of the source branch and the output.

In accordance with yet a further feature of the invention, an output is connected between the output stage of the source branch and the output stage of the sink branch; and the circuit transistor of the sink branch is configured between the output-side transistor of the sink branch and the output.

In accordance with an added feature of the invention, there is provided, at least one further output-side transistor; an output is connected between the output stage of the source branch and the output stage of the sink branch; and the further output-side transistor is configured between the output and the circuit transistor of the source branch.

In accordance with an additional feature of the invention, there is provided, at least one further output-side transistor; an output is connected between the output stage of the source branch and the output stage of the sink branch; and the further output-side transistor is configured between the output and the circuit transistor of the sink branch.

In accordance with another feature of the invention, there is provided, at least one input-side symmetrical transistor configured symmetrically with respect to the circuit transistor of the source branch.

In accordance with a further feature of the invention, there is provided, at least one input-side symmetrical transistor that is configured symmetrically with respect to the circuit transistor of the sink branch.

In accordance with a further added feature of the invention, there is provided, a capacitor having a first terminal and a second terminal. The circuit transistor of the source branch has a gate connected to the first terminal of the capacitor. The output-side transistor of the source branch has a gate connected to the second terminal of the capacitor.

In accordance with a further additional feature of the invention, there is provided, a capacitor having a first terminal and a second terminal. The circuit transistor of the sink branch has a gate connected to the first terminal of the capacitor. The output-side transistor of the sink branch has a gate connected to the second terminal of the capacitor.

In accordance with yet an added feature of the invention, the sink branch is of a mirror-inverted design with respect to the source branch.

In accordance with yet an additional feature of the invention, the output-side transistor of the source branch and the circuit transistor of the source branch are PMOS transistors; and the output-side transistor of the sink branch and the circuit transistor of the sink branch are NMOS transistors.

In accordance with yet another feature of the invention, the output-side transistor of the source branch and the circuit transistor of the source branch are p-JFET transistors; and the output-side transistor of the sink branch and the circuit transistor of the sink branch are n-JFET transistors.

With the foregoing and other objects in view there is provided, in accordance with the invention, a phase locked loop that includes a charge pump. The charge pump includes: a source branch for producing a source current, the source branch including at least one current mirror and a transistor; a sink branch for producing a sink current; a reference stage; and a regulating device. At least one of the source branch and the sink branch have an input-side transistor. The source branch includes an output stage having an output-side transistor and a circuit transistor. The sink branch includes an output stage having an output-side transistor and a circuit transistor. A first branch is chosen as either the source branch or the sink branch. The first branch receives and is controlled by a reference current. The reference stage simulates the output stage of the source branch, at least with regard to the output-side transistor of the source branch. The reference stage also simulates the output stage of the sink branch, at least with regard to the output-side transistor of the sink branch. The regulating device is for regulating a second branch that is chosen to be either the source branch or the sink branch. The second branch is different from the first branch. The reference stage generates an equivalent symmetrical current that replicates a fault current. The symmetrical current controls the regulating device.

In accordance with an added feature of the invention, the PLL includes a voltage controlled oscillator that provides an output frequency for controlling the charge pump, and a control loop that has at least one phase detector for determining a phase shift between a reference frequency and the output frequency from the voltage controlled oscillator. A loop filter is connected to the charge pump. The loop filter has an output for controlling the voltage controlled oscillator.

In accordance with an added feature of the invention, the PLL includes a crystal oscillator and a downstream reference divider for producing the reference frequency.

The inventors have recognized the following:

In the known circuit configuration, the source and sink currents are produced by generating two reference currents i_ref_source and i_ref_sink and supplying them to the output stage of the charge pump. These currents are transformed using the mirror factor n which has been set, so that i_source=n*i_ref_source and i_sink=n*i_ref_sink. In this case, the symmetry of the output currents with the condition |i_source|=|i_sink| is effected first using the reference currents i_ref_source and i_ref_sink and/or using the mirror factors for the source branch mp1 & mp2 relating to mp3 & mp4 and using the mirror factors for the source branch mn1 & mn2 relating to mn3 & mn4. Alterations to the properties of the transistors as a result of the operating conditions that have altered with respect to the optimum can very easily have adverse effects on the symmetry in this case.

The invention allows this uncertainty in the symmetry of the reference currents to be avoided by generating not two reference currents, but only a single reference current, which is fed either into the reference path mp3 & mp4 for the source branch or into the reference path mn3 & mn4 for the sink branch. It is thus additionally possible to add a reference circuit that simulates the output stage of the charge pump exactly and whose output receives the tuning voltage v_tune from the output of the charge pump Pdout, so that a symmetrical current i_sym is generated which simulates the fault current i_fault. In this case, the tuning voltage needs to be loaded as little as possible so as not to corrupt it with the additional measures. The symmetrical current i_sym is then measured. The charge pump section which is not attached to the fixed reference current (source or sink) is readjusted such that a symmetrical current i_sym of zero is produced. The regulation is effected using the gate voltage of the free path in the output stage or in the reference circuit. In variant embodiments, the switching transistors mn2a and mp2a likewise contained in the reference path simulating the output stage path can either be omitted, moved to the interior, or as shown in FIG. 4, for example, can be incorporated on the outside. A symmetrical current i_sym regulated to 0 also causes a fault current i_fault of 0, since the output stage and the reference circuit operate under the same conditions.

Hence, the principle of open loop control in the prior art is thus replaced by closed loop control. The symmetry which can be achieved is then independent of ambient influences and technological fluctuations, and is better than that in the prior art by orders of magnitude. The control range for the voltage v_tune is significantly extended while maintaining the symmetry of the current.

In line with this inventive concept, the inventors propose developing a circuit configuration for a charge pump having an input side, an output side, and at least one current mirror and a transistor that are associated with a source branch for producing a source current. A sink branch is provided for producing a sink current. At least one path has an input-side transistor and both paths have an output stage, each containing at least one output-side transistor and a circuit transistor. A first one of the paths is controlled via a reference current. A reference stage is additionally provided in which the output stage of the paths is simulated, at least in terms of the output-side transistors. A symmetrical current is generated on the reference stage, which is equivalent to the fault current and controls a device for regulating the second one of the paths.

Within the context of this invention, simulation means either a copy or a topologically identical circuit containing transistors in which all of the transistor widths are enlarged or reduced by the same factor as compared with those in the output stage. This makes it possible to generate a symmetrical current i_sym, replicating the fault current i_fault, between the output stages without influencing the output stage of the charge pump. This symmetrical current can control a device for regulating the second path and hence sets up a control loop for preventing fault currents. Since closed loop control has now been realized, temperature influences and other variable and detrimental properties of the electronic components in the charge pump that influence the symmetry of current are also corrected automatically.

In line with the inventive concept, the device for regulating the second path can have at least one operational amplifier OP2 with inputs receiving a voltage difference proportional to the fault current and with an output that is used to influence the second path.

In another refinement of the inventive circuit configuration, the device for regulating the second path additionally has a buffer amplifier, preferably an operational amplifier connected as a voltage follower, for simulating the fault current. This means that the voltage v_tune at the output Pdout remains largely unloaded, is copied and is available to the control stage as an auxiliary means for simulating the fault current i_fault by a symmetrical current i_sym. In addition, a loop filter can be provided between the output stage and the reference circuit, in particular when the charge pump is used in a phase locked loop.

In accordance with another inventive development of the circuit configuration, the device used for regulating the second circuit can be an attenuation element τ located at the input of the buffer amplifier or of the operational amplifier connected as a voltage follower. This attenuation element τ can be used to set the speed of readjustment of the respective second path. On the basis of the invention, the attenuation element τ can include a resistor and a capacitor. The time constant of this attenuation element should then be set such that the regulation is fast enough, but such that undesirable tendencies toward oscillation nevertheless do not arise. This means that when a loop filter is present, this time constant essentially needs to be matched to the loop filter.

On the basis of the invention, the second path can also have an input-side transistor if the operational amplifier OP2 that is used has a current output. In addition, the circuit configuration can advantageously be extended such that at least one circuit transistor mn2, mp2 is arranged between the output of the charge pump and the output-side transistor mn1, mp1.

The at least one circuit transistor mn2, mp2 can also be arranged such that at least one output-side transistor mn1, mp1 is arranged between the output of the charge pump and a circuit transistor mn2, mp2.

In addition, the symmetrical properties of the circuit configuration are improved when at least one input-side symmetrical transistor mn4, mp4 arranged symmetrically with respect to a circuit transistor mn2, mp2 is provided.

To speed up the circuit operations, that is to say, in particular, to use the charge pump for high frequency PLLs, a capacitor C_sink, C_source can be connected between the gate of at least one circuit transistor mn2, mp2 and the gate of the output-side transistor mn1, mp1 in the same path.

Another advantage is when the sink branch is of mirror-inverted design with respect to the source branch.

The transistors used in the source branch can be in the form of PMOS transistors, and the transistors in the sink branch can be in the form of NMOS transistors.

In addition, it is also possible for the transistors in the source branch to be in the form of p-Jfets, and for the transistors in the sink branch to be in the form of n-Jfets.

The inventive design of the circuit configuration for a charge pump results in the following advantages:

1. The greatest symmetry for source and sink currents i_source, i_sink is obtained, irrespective of the voltage v_tune present at the output Pdout, irrespective of the technological variations (e.g. threshold voltage, matching, etc.), and irrespective of the operating temperature which exists.

2. A maximum useable range is obtained for the voltage v_tune up to close to the boundaries of the available supply voltage.

3. Dimensions can be set for optimum dynamic symmetry of the output transistors, since the NMOS and PMOS transistors can be of the same size as a result of the closed loop control, and hence parasitic elements of equal magnitude are also present.

4. A significant reduction (halving) of the circuit complexity for reference current production is achieved, since now only one reference current i_ref is needed. Hence, the entire complexity for obtaining symmetry between the two reference currents available in the prior art i_ref_sink and i_ref_source is also eliminated.

In line with the inventive concept, the charge pump illustrated above can preferably be used in a phase locked loop (PLL). Such an inventive phase locked loop has a control loop including at least one phase detector PD for determining a phase shift between a reference frequency $F_{ref}$ and a divided-down output frequency $F_{vco}/N$ from a voltage controlled oscillator VCO that controls the charge pump CP. A loop filter LF is connected to the charge pump CP and the output of the loop filter controls the voltage controlled oscillator VCO.

In addition, a crystal oscillator Q and a downstream reference divider R can be provided to produce the reference frequency $F_{ref}$.

It goes without saying that the features of the invention which have been cited above and which will be explained below can be used not only in the respectively indicated combination, but also in other combinations or on their own, without departing from the scope of the invention.

Other features which are considered as characteristic for the invention are set forth in the appended claims.

Although the invention is illustrated and described herein as embodied in a charge pump, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
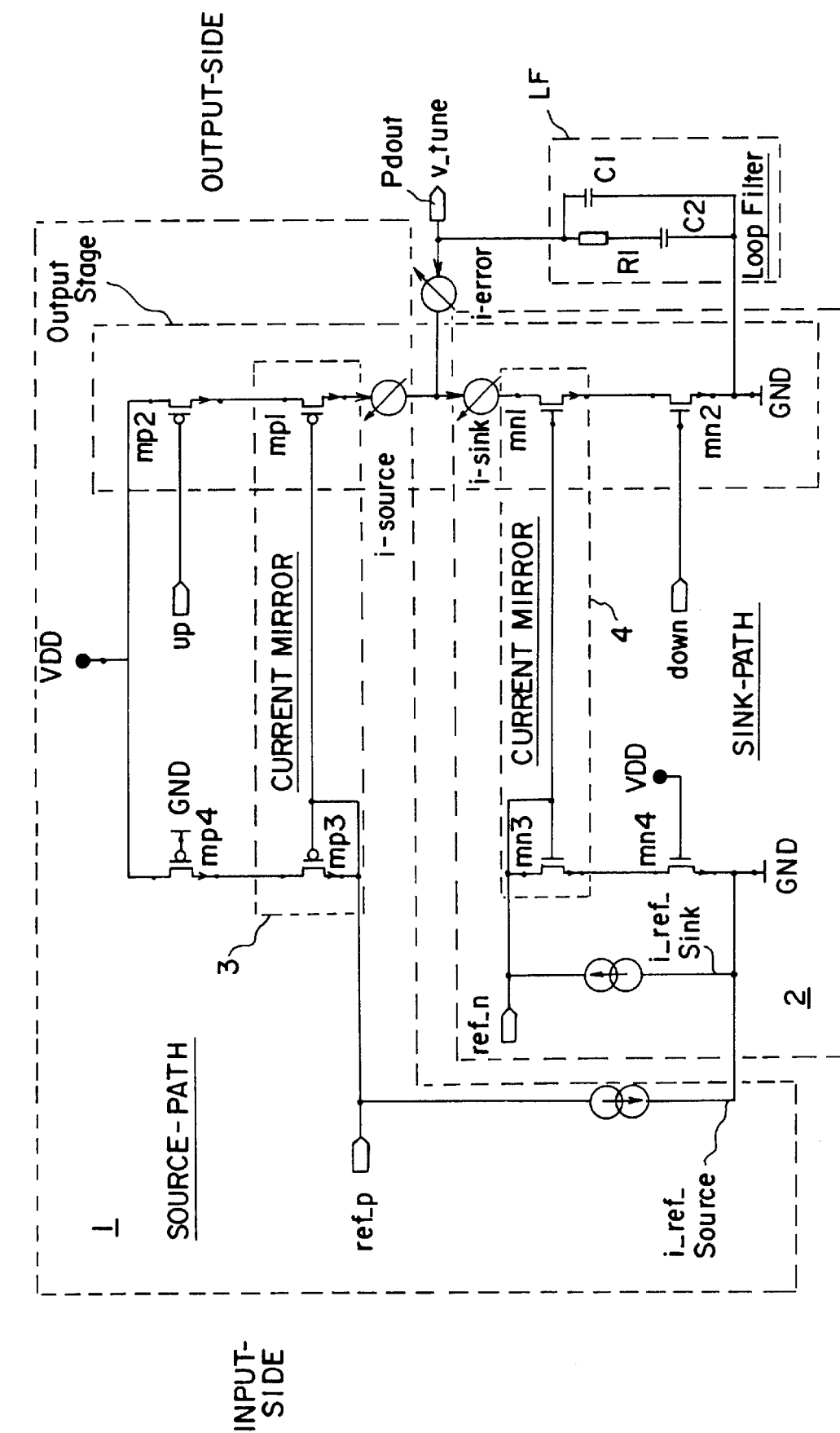
FIG. 1 shows a prior art charge pump for a PLL.

Referring now to the figures of the drawing in detail and first, particularly, to FIG. 1 thereof, there is shown a prior art charge pump CP having inputs i_ref_source, i_ref_sink, UP, and DOWN. The charge pump CP has an output Pdout.

For the purposes of better understanding, functional areas are framed in dashed lines.

The charge pump CP has a source branch 1 and a sink branch 2, arranged in mirror-inverted form with respect to the source branch 1. Each path 1, 2 includes a respective current mirror 3 or 4. Current mirror 3 includes an input side transistor mp3 and an output side transistor mp1. Current mirror 4 includes an input side transistor mn3 and an output side transistor mn1 Output-side transistor mp1 is connected to a circuit transistor mp2 that is connected to the UP input. Output-side transistor mn1 is connected to a circuit transistor mn2 that is connected to the DOWN input. In line with the pulses that are applied to the UP input or to the DOWN input, current flows from or to the output Pdout, which produces a voltage v_tune. This group of output-side transistors mp1, mp2, mn1, mn2 forms the output stage of the charge pump.

For reasons of symmetry, two symmetrical transistors mp4 and mn4 are additionally provided. In addition, a capacitor C_source and C_sink can be connected between the gate of the circuit transistors mp2 and mn2 and the gate of the output-side transistor mp1 and mn1 or the input i_ref_source or i_ref_sink, in order to speed up the switching operations in the output-side transistors. For purposes of clarity, these capacitors have not been shown. However, it is pointed out that such capacitors are not absolutely necessary in order for the charge pump to be able to work.

In addition, the output of the charge pump also has a loop filter LF connected to it, which can actually be counted as part of a PLL loop. The loop filter LF includes two capacitors C1, C2, and a resistor R1. The loop filter LF integrates the pump output current.

Figure 2:
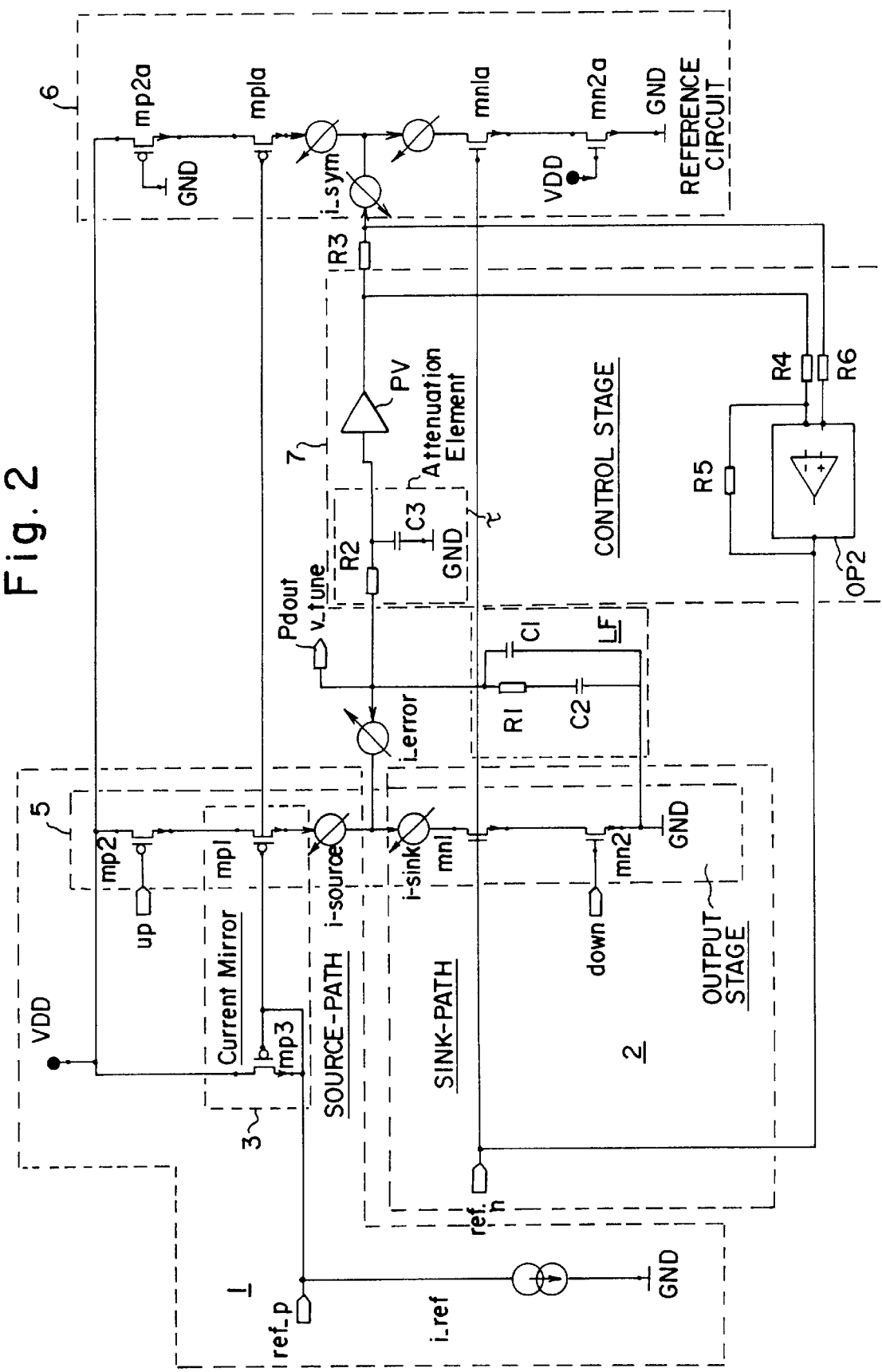
FIG. 2 shows a simple inventive circuit configuration for a charge pump having a buffer amplifier and an operational amplifier.

FIG. 2 shows a simple inventive circuit configuration for a charge pump in which only a single reference current i_ref_is now needed instead of two reference currents. In its simplest version, the charge pump also has only a single current mirror 3 that is arranged on the source side of the charge pump. The output stage 5 has the circuit transistors mp2 and mn2, which switch the current through to transistors mp1 and mn1 at the output.

The design also includes a reference circuit 6 in which the output stage 5 is repeated. This means that the transistors mp1, mp2, mn1 and mn2 are reproduced by the transistors mp1a, mp2a, mn1a and mn2a. The gates of mp1a and mp1 are coordinated or connected and the gates of mn1a and mn1 are coordinated or connected. Note that mp2a and mn2a are not connected to the UP and DOWN inputs.

A control stage 7, which has a buffer amplifier PV, is arranged between the reference circuit 6 and the output stage 5. The buffer amplifier PV provides the voltage v_tune, via a resistor R3, to the output of the reference circuit without loading the output stage 5. This produces the same fault current i_sym in the reference circuit 6 as in the output stage 5. This symmetrical current i_sym is measured as a voltage drop across the resistor R3 using an operational amplifier OP2. The output voltage from the operational amplifier OP2 forms the regulating voltage for the respective second path of the output stage 5 or the reference circuit 6 and adjusts itself such that the voltage drop across the resistor R3, and hence the symmetrical current i_sym, become equal to 0, that is to say the fault current i_fault also becomes equal to 0.

In addition to the charge pump, a loop filter LF is also connected at the output of the charge pump. Although this loop filter LF is a useful element when using the charge pump in a phase locked loop, it is not absolutely necessary for the invention.

The effect achieved by this circuit configuration, using the control stage 7, is that no fault current i_fault arises over a broad range of the voltage v_tune, and hence the secondary frequencies (spurs) that are known to occur outside the optimum operating point are reduced.

Figure 6:
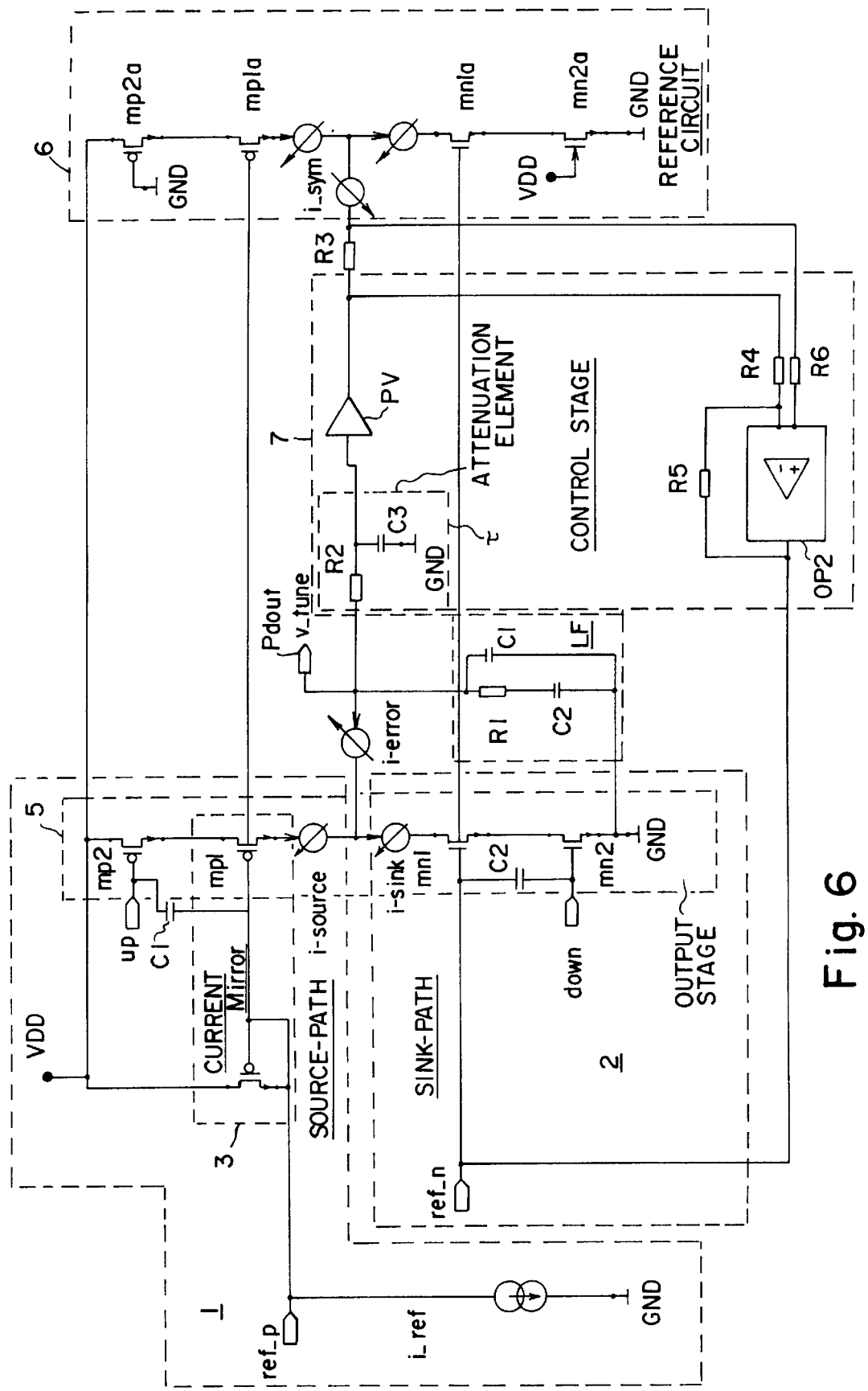
FIG. 6 shows a circuit configuration for a charge pump that is similar to that shown in FIG. 2.

FIG. 6 shows a circuit configuration for a charge pump that is almost identical to that shown in FIG. 2. Two capacitors C1 and C2 have been added to speed up switching operations in the output-side transistors mp1 and mn1. Capacitor C1 has been connected between the gate of output-side transistor mp1 and the gate of transistor mp2. Capacitor C2 has been connected between the gate of output-side transistor mn1 and the gate of transistor mn2.

Figure 3:
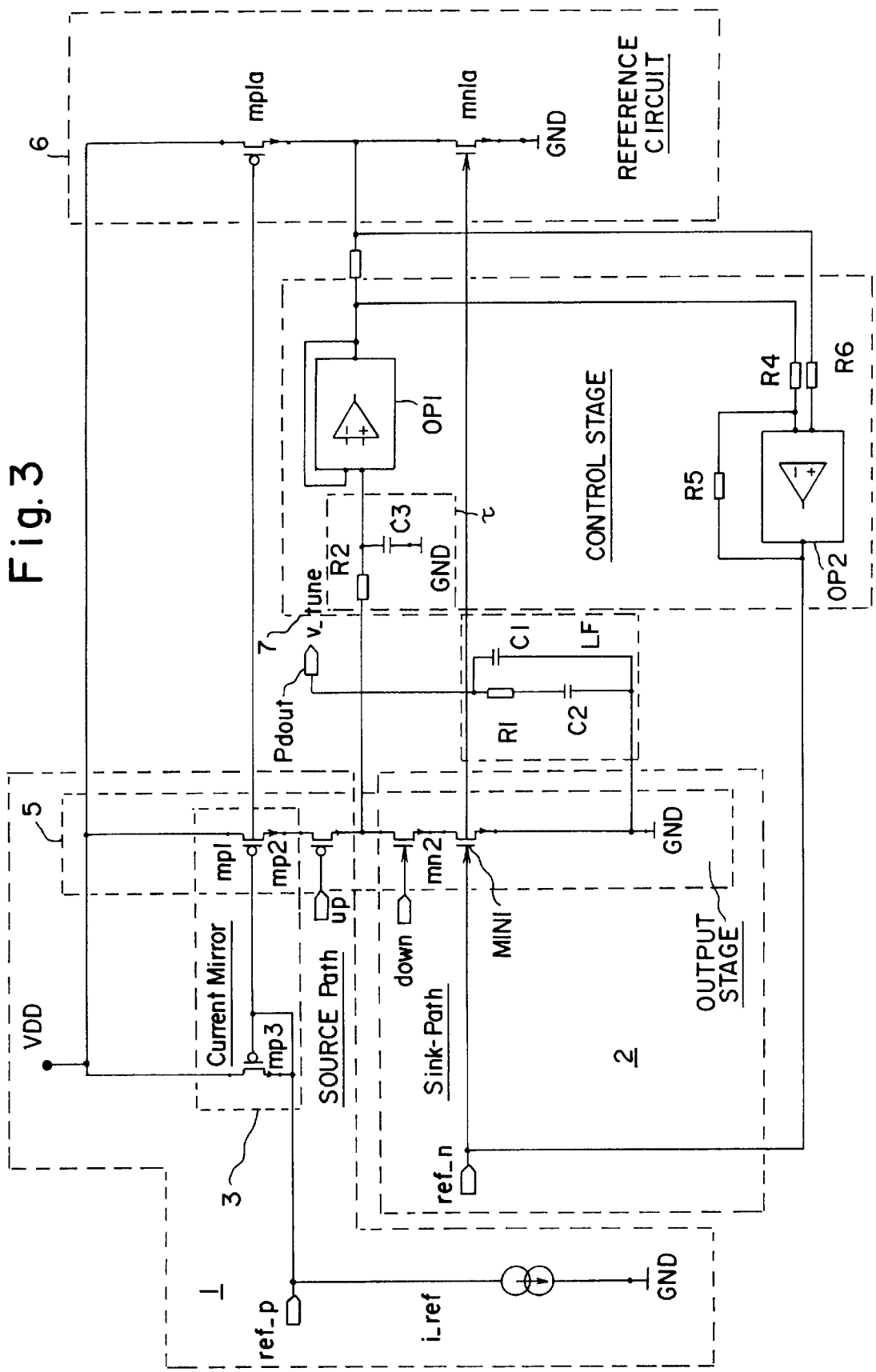
FIG. 3 shows a simple inventive circuit configuration for a charge pump having two operational amplifiers and interchanged circuit transistors and output-side transistors.

FIG. 3 shows a variation of the simple circuit configuration from FIG. 2. In the output stage 5 of the charge pump, the position of the circuit transistor mp2 has been interchanged with the position of the output-side transistor mp1, and the position of the circuit transistor mn2 has been interchanged with the position of the output-side transistor mn1. Accordingly, it has been possible to dispense with the transistors mp2a and mn2a in the reference circuit 6.

The buffer amplifier PV has now been replaced with an operational amplifier OP1. An attenuation element τ (in this case including a resistor R2 and a capacitor C3), which can be used to set the speed of readjustment of the sink current i_sink, has been configured upstream of the operational amplifier OP1.

Figure 4:
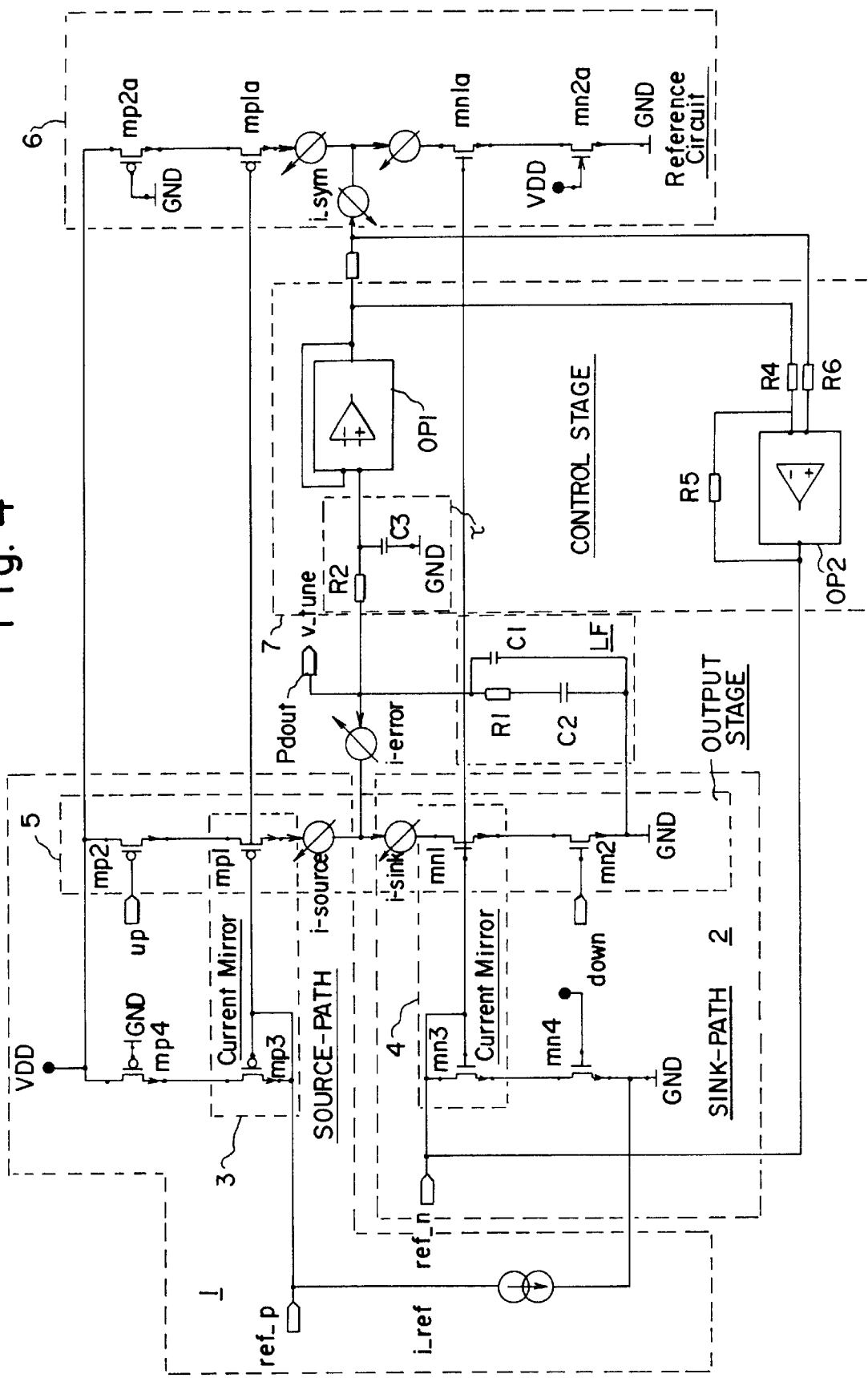
FIG. 4 shows an improved inventive circuit configuration for a charge pump having two operational amplifiers with additional symmetrical transistors.

FIG. 4 shows the best embodiment of the circuit configuration for an inventive charge pump in which current mirrors 3 and 4 have been symmetrically arranged in the source and sink branches. The current mirrors 3, 4 each include a respective input-side transistor mn3 and mp3 and a respective output-side transistor mn1 and mp1. The circuit transistor mp2 is arranged at the source input (based on source, drain and gate of a transistor) of the source-side output-side transistor mp1. The gate input of the circuit transistor mp2 is connected to the UP input. Similarly, the circuit transistor mn2 is arranged at the source input (based on source, drain and gate of a transistor) of the sink-side output-side transistor mn1. The gate input of the circuit transistor mn2 is connected to the DOWN input. For reasons of symmetry, the circuit transistors on the input side have a respective symmetrical transistor mn4 and mp4 associated with them, which are connected to the sources of the input-side transistors. The source branch of the circuit is controlled by means of the reference current i_ref. The input-side transistors mn3 and mn4 are useful if the operational amplifier OP2 has a high-impedance current output, otherwise they can be omitted.

The output stage 5, including the transistors mn1, mn2, mp1 and mp2, is simulated in a reference circuit 6 containing the transistors mn1a, mn3a, mp1a and mp3a, where the gates of the output-side transistors mp1 and mp1a and mn1 and mn1a are connected to one another and all need to have the same relative size with regard to their corresponding transistors in the output stage.

A buffer amplifier is arranged between the output Pdout of the output stage 5 and the equivalent output of the reference circuit 6. The buffer amplifier is in the form of an operational amplifier OP1 which copies the fault current i_fault as a symmetrical current i_sym. The voltage v_tune at the output Pdout remains as unloaded as possible. Connected between the output Pdout of the output stage 5 and the operational amplifier OP1 is an attenuation element τ. The attenuation element τ includes a resistor R2 that is preferably variable, and a grounded capacitor C3. The attenuation element influences the reaction speed of the control loop.

A resistor R3 is located between the operational amplifier OP1 connected as a voltage follower and the reference circuit 6. The voltage drop produced by the symmetrical current i_sym is tapped off across the resistor R3 and is routed to a second operational amplifier OP2. On the basis of the symmetrical current i_sym measured, the operational amplifier OP2 now regulates the sink branch such that the symmetrical current i_sym and hence the fault current i_fault at the output Pdout of the charge pump are kept at zero irrespective of the prevailing operating temperatures of the output voltage v_tune that is produced and of the properties of electronic components used.

The transistors mn3 and mn4 which are now provided over the simple variants shown in FIGS. 2 and 3 now apply a basic load to the operational amplifier OP2 in any operating state, which results in a more stable circuit, depending on the type of operational amplifier that is used. This circuit configuration thus solves the charge pump's symmetry problems outlined above in the entire control range in the best way. This means that virtually the whole range of the supply voltage from 0 to VDD is also available for the range of the voltage v_tune at the output Pdout. In practice, this means that only a reserve of approximately 100 mV, as compared with approximately 500 mV in the prior art, for a supply voltage VDD of 2.8 V, now need be expected.

Figure 5:
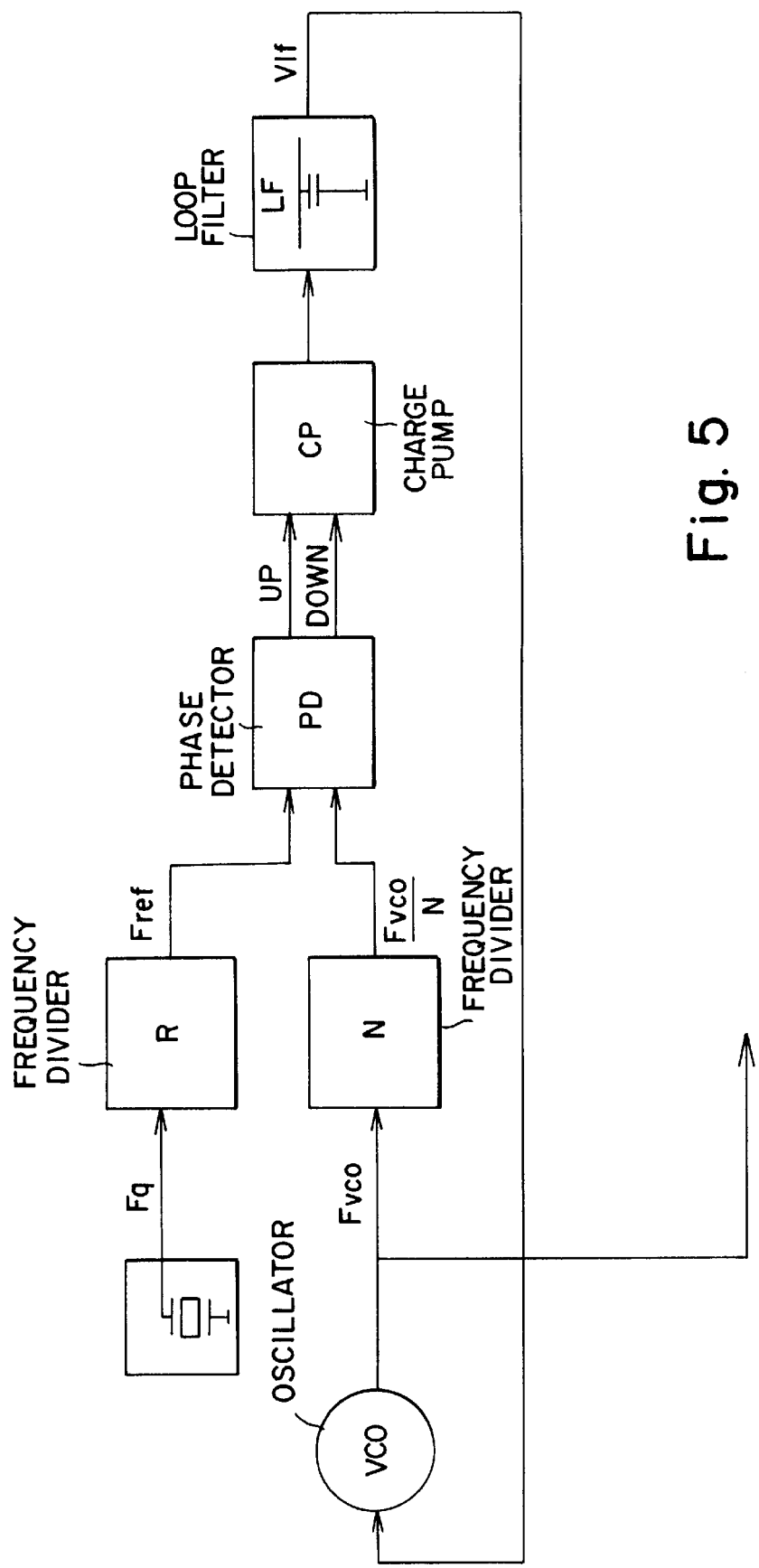
FIG. 5 shows a PLL into which the inventive charge pump can be incorporated.

By way of example, FIG. 5 also shows a phase locked loop having an inventive charge pump CP. The PLL includes a phase detector PD that compares two frequencies $F_{ref}$ and $F_{vco}/N$ for any relative phase shift. The reference frequency $F_{ref}$ is produced from a crystal-stabilized frequency $F_q$, which a crystal oscillator Q produces. The crystal oscillator Q supplies the crystal-stabilized frequency $F_q$ to a reference divider R where it is reduced by a particular division ratio. The second frequency $F_{vco}/N$ supplied comes from a voltage controlled oscillator VCO and is divided down to the frequency $F_{vco}/N$ using a divider. The output of the phase detector PD produces two pulse width modulated pulse trains UP and DOWN whose pulse widths have a fixed relationship with respect to the phase difference between the two input frequencies $F_{ref}$ and $F_{vco}/N$. If the frequency $F_{vco}/N$ is higher than the frequency $F_{ref}$, or if the frequency $F_{vco}/N$ is excessive in comparison with $F_{ref}$, or if the phase of the frequency $F_{vco}/N$ leads that of the reference frequency $F_{ref}$, the phase detector switches on the DOWN output for longer than the UP output.

A similar situation applies conversely, with correspondingly reversed phases. If the phases are the same, that is to say if $F_{ref}$ is equal to $F_{vco}/N$, anti-backlash pulses (ABL pulses) are output at both outputs of the phase detector. The UP and DOWN pulse trains actuate the charge pump CP, whose output has the loop filter connected to it. This loop filter acts as an integrator. The voltage $V_{LF}$ of the loop filter LF is used to control the voltage controlled oscillator VCO, as a result of which, the control loop of the PLL is closed.

We claim:

1. A charge pump, comprising:
   a source branch for producing a source current, said source branch including at least one current mirror and a transistor;
   a sink branch for producing a sink current;
   a reference stage; and
   a regulating device;
   at least one branch selected from the group consisting of said source branch and said sink branch having an input-side transistor;
   said source branch including an output stage having an output-side transistor and a circuit transistor;
   said sink branch including a n output stage having an output-side transistor and a circuit transistor;
   a first branch selected from the group consisting of said source branch and said sink branch receiving and being controlled by a reference current;
   said reference stage simulating said output stage of said source branch, at least with regard to s aid output-side transistor of said source branch;
   said reference stage simulating said output stage of said sink branch, at least with regard to said output-side transistor of said sink branch;
   said regulating device for regulating a second branch selected from group consisting of said source branch and said sink branch, said second branch being different from said first branch;
   said reference stage generating an equivalent symmetrical current that replicates a fault current; and
   the symmetrical current controlling said regulating device.

2. The charge pump according to claim 1, wherein:
   said regulating device includes at least one operational amplifier;
   said operational amplifier has inputs receiving a voltage proportional to the symmetrical current and to the fault current; and
   said operational amplifier has an output that influences said second branch.

3. The charge pump according to claim 1, wherein said regulating device includes a buffer amplifier for simulating the fault current.

4. The charge pump according to claim 3, wherein said buffer amplifier is an operational amplifier connected as a voltage follower.

5. The charge pump according to claim 1, in combination with a loop filter, wherein:
   said output stage of said source branch and said output stage of said sink branch form a combined output stage; and said loop filter is connected between said combined output stage and said regulating device.

6. The charge pump according to claim 1, said regulating device includes an attenuation element.

7. The charge pump according to claim 1, wherein:
said first branch includes said input-side transistor; and
said second branch includes an input-side transistor.

8. The charge pump according to claim 1, wherein: at least one circuit transistor selected from the group consisting of said circuit transistor of said source branch and said circuit transistor of said sink branch is an output-side transistor.

9. The charge pump according to claim 1, comprising:
an output connected between said output stage of said source branch and said output stage of said sink branch;
said circuit transistor of said source branch being configured between said output-side transistor of said source branch and said output.

10. The charge pump according to claim 1, comprising:
an output connected between said output stage of said source branch and said output stage of said sink branch;
said circuit transistor of said sink branch being configured between said output-side transistor of said sink branch and said output.

11. The charge pump according to claim 1, comprising:
at least one further output-side transistor; and
an output connected between said output stage of said source branch and said output stage of said sink branch;
said further output-side transistor configured between said output and said circuit transistor of said source branch.

12. The charge pump according to claim 1, comprising:
at least one further output-side transistor; and
an output connected between said output stage of said source branch and said output stage of said sink branch;
said further output-side transistor configured between said output and said circuit transistor of said sink branch.

13. The charge pump according to claim 1, comprising: at least one input-side symmetrical transistor configured symmetrically with respect to said circuit transistor of said source branch.

14. The charge pump according to claim 1, comprising: at least one input-side symmetrical transistor configured symmetrically with respect to said circuit transistor of said sink branch.

15. The charge pump according to claim 1, comprising:
a capacitor having a first terminal and a second terminal;
said circuit transistor of said source branch having a gate connected to said first terminal of said capacitor; and
said output-side transistor of said source branch having a gate connected to said second terminal of said capacitor.

16. The charge pump according to claim 1, comprising:
a capacitor having a first terminal and a second terminal;
said circuit transistor of said sink branch having a gate connected to said first terminal of said capacitor; and
said output-side transistor of said sink branch having a gate connected to said second terminal of said capacitor.

17. The charge pump according to claim 1, wherein said sink branch is of a mirror-inverted design with respect to said source branch.

18. The charge pump according to claim 1, wherein:
said output-side transistor of said source branch and said circuit transistor of said source branch are PMOS transistors; and
said output-side transistor of said sink branch and said circuit transistor of said sink branch are NMOS transistors.

19. The charge pump according to claim 1, wherein:
said output-side transistor of said source branch and said circuit transistor of said source branch are p-JFET transistors; and
said output-side transistor of said sink branch and said circuit transistor of said sink branch are n-JFET transistors.

20. A phase locked loop, comprising:
a charge pump including:
a source branch for producing a source current, said source branch including at least one current mirror and a transistor;
a sink branch for producing a sink current;
a reference stage; and
a regulating device;
at least one branch selected from the group consisting of said source branch and said sink branch having an input-side transistor;
said source branch including an output stage having an output-side transistor and a circuit transistor;
said sink branch including an output stage having an output-side transistor and a circuit transistor;
a first branch selected from the group consisting of said source branch and said sink branch receiving and being controlled by a reference current;
said reference stage simulating said output stage of said source branch, at least with regard to said output-side transistor of said source branch;
said reference stage simulating said output stage of said sink branch, at least with regard to said output-side transistor of said sink branch;
said regulating device for regulating a second branch selected from group consisting of said source branch and said sink branch, said second branch being different from said first branch;
said reference stage generating an equivalent symmetrical current that replicates a fault current; and
the symmetrical current controlling said regulating device.

21. The phase locked loop according to claim 20, comprising:
a voltage controlled oscillator providing an output frequency for controlling said charge pump;
a control loop having at least one phase detector for determining a phase shift between a reference frequency and the output frequency from said voltage controlled oscillator; and
a loop filter connected to said charge pump;
said loop filter having an output controlling said voltage controlled oscillator.

22. The phase locked loop according to claim 21, comprising:
a crystal oscillator and a downstream reference divider for producing the reference frequency.

23. The phase locked loop according to claim 20, comprising:
a crystal oscillator and a downstream reference divider for producing a reference frequency.

* * * * *